(12) United States Patent
Tada et al.

(10) Patent No.: US 6,610,791 B2
(45) Date of Patent: Aug. 26, 2003

(54) PHOTOSENSITIVE COMPOUND AND PHOTOSENSITIVE RESIN

(75) Inventors: Kentaro Tada, Chiba (JP); Toru Shibuya, Chiba (JP)

(73) Assignee: Toyo Gosai Kogyo Co., Ltd., Chiba (JP)

( * ) Notice: Subject to any disclaimer, the term of this patent is extended or adjusted under 35 U.S.C. 154(b) by 0 days.

(21) Appl. No.: 09/783,056

(22) Filed: Feb. 14, 2001

(65) Prior Publication Data

US 2001/0047068 A1 Nov. 29, 2001

(30) Foreign Application Priority Data

Feb. 14, 2000 (JP) ........................................ 2000-035734

(51) Int. Cl.[7] .................................................. C08F 8/34
(52) U.S. Cl. ..................... 525/330.4; 525/344; 548/183
(58) Field of Search ........................ 548/183; 525/330.4, 525/349

(56) References Cited

FOREIGN PATENT DOCUMENTS

| EP | 0878739 | 11/1998 |
|---|---|---|
| JP | 5027404 | 9/1974 |
| JP | 50141403 | 11/1975 |
| JP | 565761 | 2/1981 |
| JP | 565762 | 2/1981 |
| JP | 5611906 | 2/1981 |
| JP | 2204750 | 8/1990 |
| JP | 426849 | 1/1992 |
| JP | 511442 | 1/1993 |
| JP | 5113661 | 5/1993 |
| JP | 6239930 | 8/1994 |
| JP | 1031076 | 11/1998 |

OTHER PUBLICATIONS

Shibuya, et al., *Journal of Photopolymer Science and Technology*, 1999, vol. 12, No. 2, Abstract of pp. 377–381.

*Primary Examiner*—Bernard Lipman
(74) *Attorney, Agent, or Firm*—Huntley & Associates

(57) ABSTRACT

The invention provides a photosensitive compound which can be used to prepare a photosensitive resin, and a photosensitive resin obtained from the compound. The compound has a moiety represented by formula (I) or (II):

wherein
$R^1$ represents a hydrogen atom, an alkyl group, an aryl group, or an aralkyl group;
Y is selected from the following formula groups:

wherein each of $R^2$ and $R^3$ represents a hydrogen atom, an alkyl group, an aryl group, or an aralkyl group, and l is an integer of 1 to 5; and
Ar is selected from the following formula groups:

wherein X represents lithium, sodium, potassium, ammonium, monoalkylammonium, dialkylammonium, trialkylammonium, or tetraalkylammonium.

5 Claims, No Drawings

PHOTOSENSITIVE COMPOUND AND PHOTOSENSITIVE RESIN

BACKGROUND OF THE INVENTION

1. Field of the Invention

The present invention relates to a novel photosensitive compound and a photosensitive resin and, more particularly, to a photosensitive compound and a photosensitive resin having a wide range of utility including, for example, color cathode-ray tubes and other display tubes, screen printing, immobilized enzymes, PS plates, etching resists, and sand-blasting.

2. Background Art

Conventionally, there have been known photosensitive units containing a photosensitive resin obtained through a condensation reaction between non-modified polyvinyl alcohol and a quaternary ammonium salt such as a styrylpyridinium salt or a styrylquinolinium salt (hereafter, resists of this type are referred to as PVA-SbQ-based resists) (see Japanese Patent Publication (kokoku) Nos. 56-5761 and 56-5762, and Japanese Patent Application Laid-Open (kokai) No. 56-11906).

Although these PVA-SbQ-based resists have advantages such as shorter time required for photosensitization, their ionicity is limited to cationic, to thereby limit use and compositions of the resists. In addition, since a mercury lamp (365 nm) and a metal halide light source (400 nm) are used as light sources for exposure, 4-methylquinoline or a similar substance must be used so as to set the photosensitive wavelength of the resists in a longer wavelength range. This is disadvantageous, because of the accompanying increase in cost.

Therefore, in certain uses, such as color cathode-ray tubes, other display tubes, and screen printing, there is still need for resists that exhibit excellent sensitivity at a wavelength as long as 400 nm and that are dissolvable or dispersible in an aqueous solvent. Particularly, in consideration of the excellent characteristics, as a binder polymer, of polyvinyl alcohol (hereinafter abbreviated PVA) for use in the formation of phosphor patterns, demand exists for PVA-based resists of a certain type which have longer photosensitive wavelengths than those possessed by PVA-SbQ-based resists, and in addition, which, with regard to ionicity, permit selection between anionic and nonionic in accordance with use.

Thus, in order to provide a photosensitive resin meeting the aforementioned demand, the present inventors have developed a photosensitive resin produced by introducing an azide compound having a rhodanine skeleton into modified or non-modified poly(vinyl alcohol) through acetalization (hereinafter the resin is referred to as PVA-ARB-based resist) and have filed an application for patent (Japanese Patent Application Laid-Open (kokai) No. 10-310769). The PVA-ARB-based resist proposed in the publication is an excellent photoresist, having high photosensitivity and attaining photosensitivity at a longer wavelength. The steps for synthesizing an azide compound having a rhodanine skeleton and an acetal group—which serves as a photosensitive unit of the PVA-ARB-based resist—include reaction in which an acetal-group-containing amine is transformed to a rhodanine ring.

However, acetal-group-containing amines are comparatively expensive and provide a poor synthesis yield in terms of rhodanine ring formation. Thus, employment of the amines is disadvantageous, due to high production costs. In addition, since the aforementioned photosensitive unit of the PVA-ARB-based resist has poor solubility in water, the amount of the unit to be introduced into a water-soluble polymer is limited. An increase in the amount results in poor developability of unexposed portions of the resist with water and, as a problem in production of photosensitive polymers, a prolonged period of time for dissolving an aqueous solvent during introduction of the unit into a polymer.

SUMMARY OF THE INVENTION

In view of the foregoing, an object of the present invention is to provide a novel photosensitive compound which can be used to prepare a corresponding photosensitive resin. Another object is to provide a photosensitive resin prepared from the photosensitive compound.

The present inventors have conducted extensive studies so as to solve the aforementioned problems, and have found that a novel rhodanine-skeleton-containing azide compound can be produced through condensation of a rhodanine compound and an aldehyde, the rhodanine compound having a variety of substituents such as an acetal group and an amido bonding portion and the aldehyde being an azido-group-containing water-soluble aldehyde or an aldehyde having an azido-group-containing aromatic ring. The present invention has been accomplished on the basis of this finding.

Accordingly, in order to solve the aforementioned problems, the present invention provides a photosensitive compound having a moiety represented by the following formula (I) or (II):

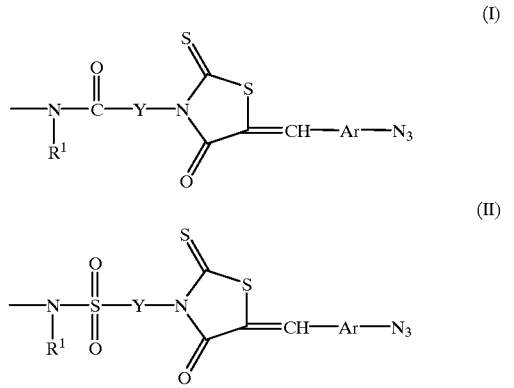

wherein $R^1$ represents a hydrogen atom, an alkyl group, an aryl group, or an aralkyl group;

Y is selected from the following formula groups:

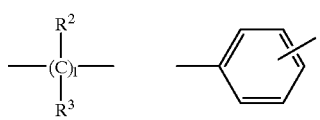

wherein each of $R^2$ and $R^3$ represents a hydrogen atom, an alkyl group, an aryl group, or an aralkyl group, and l is an integer of 1 to 5; and Ar is selected from the following formula groups:

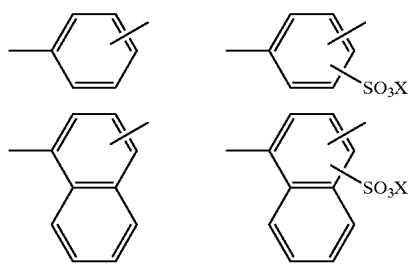

wherein X represents lithium, sodium, potassium, ammonium, monoalkylammonium, dialkylammonium, trialkylammonium, or tetraalkylammonium. In $R^1$, a C1–C5 alkyl group is preferred as the alkyl group, and examples of aryl groups or aralkyl groups include a phenyl group, a naphthyl group, and a benzyl group. In X, a C1–C5 alkyl group is preferred as the alkyl group in the monoalkyl-, dialkyl-, trialkyl-, and tetraalkylammonium groups.

Particularly, the photosensitive compound of the present invention is represented by any one of the following formulas (III) to (VI):

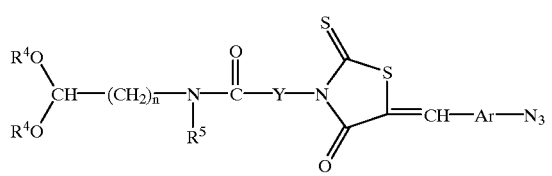
(III)

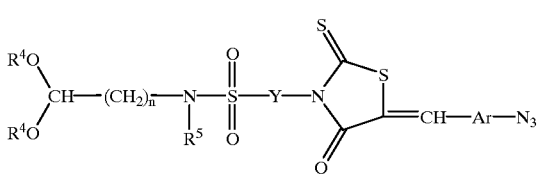
(IV)

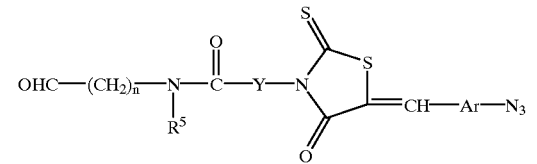
(V)

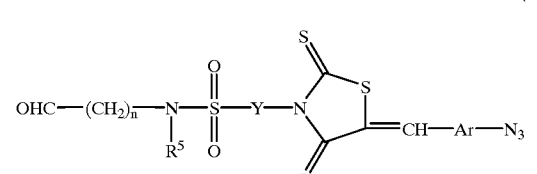
(VI)

wherein
$R^4$ is selected from among C≦6 alkyl groups, and two $R_4$'s may be joined to each other to form a group —$(CH_2)_m$— (m is 2 or 3);
n is 1, 2, or 3;
$R^5$ represents a hydrogen atom, an alkyl group, an aryl group, or an aralkyl group; and
each of Y and Ar has the same meaning as described above. In $R^5$, a C1–C5 alkyl group is preferred as the alkyl group, and examples of aryl groups or aralkyl groups include a phenyl group, a naphthyl group, and a benzyl group.

The photosensitive resin of the present invention has a moiety represented by the aforementioned formula (I) or (II). Each of $R^1$, Y, and Ar has the same meaning as described above.

Particularly, the photosensitive resin of the present invention has a structural unit represented by the following formula (VII) or (VIII):

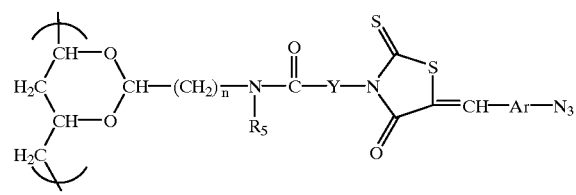
(VII)

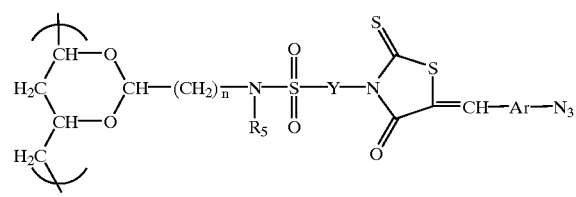
(VIII)

wherein n is 1, 2, or 3; $R^5$ represents a hydrogen atom, an alkyl group, an aryl group, or an aralkyl group; and each of Y and Ar has the same meaning as described above. In $R^5$, a C1–C5 alkyl group is preferred as the alkyl group, and examples of aryl groups or aralkyl groups include a phenyl group, a naphthyl group, and a benzyl group.

The photosensitive resin composition of the present invention contains a photosensitive resin according to the present invention.

The method of producing an azido-group-containing photosensitive compound or resin according to the present invention comprises a step represented by the following reaction scheme (1) or (2):

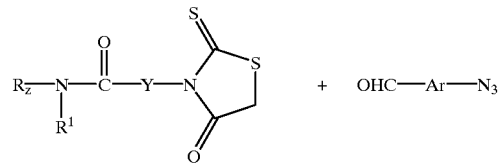
(1)

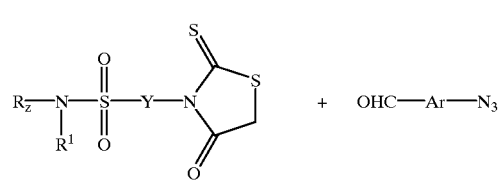
(2)

wherein Rz is a substituent or a polymer chain and each of $R^1$, Y, and Ar has the same meaning as described above. The substituent may contain an acetal group.

In the method of producing a photosensitive resin according to the present invention, the aforementioned Rz may be an acetal-group-containing substituent, and the substituent may further be reacted with a saponified product of poly(vinyl acetate).

DETAILED DESCRIPTION OF PREFERRED EMBODIMENTS

The photosensitive compound or resin according to the present invention having a moiety represented by the aforementioned formula (I) or (II) exhibits a photosensitive characteristic of an azide compound, photosensitivity at a long wavelength, and excellent stability. Introduction of such a moiety enables researchers to design a variety of photosensitive compounds or resins with relative ease. The moiety, having an amido portion, exhibits high solubility and developability with water.

Typical examples include the following moieties.

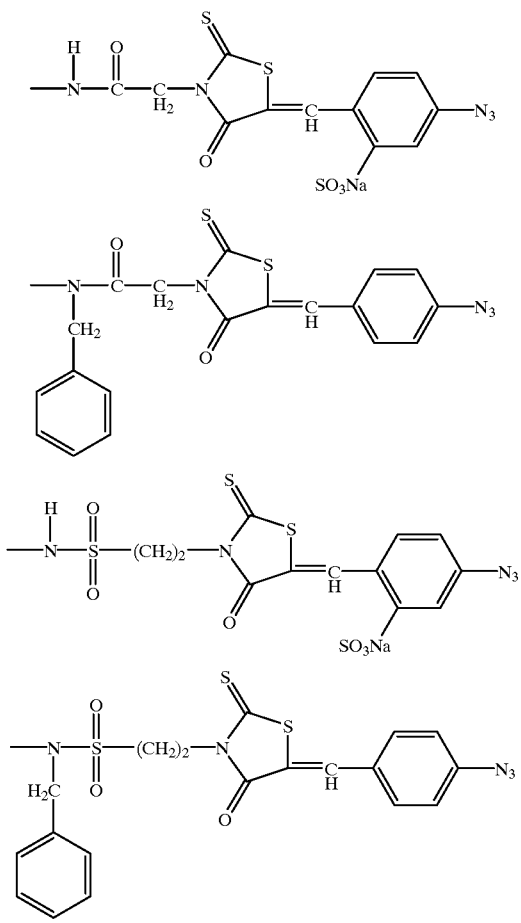

The photosensitive compound according to the present invention having a moiety represented by the aforementioned formula (I) or (II) can be prepared through a method comprising reacting a compound or polymer containing a primary or secondary amino group with an acid chloride or an active acid species of a rhodanine compound having a carboxylic acid or sulfonic acid group as an N-substituent, and, subsequently, condensing the reaction product with an azide compound through the aforementioned reaction scheme (1) or (2). Alternatively, the compound can be prepared through a method comprising condensing a rhodanine compound having a carboxylic acid or sulfonic acid group in an N-substituent through the aforementioned reaction scheme (1) or (2), and, subsequently, reacting the carboxylic acid or sulfonic acid group which is converted to the corresponding acid chloride or active acid species.

The rhodanine compound having a carboxylic acid in an N-substituent can be prepared through reaction of any of a variety of amino acid compounds to form a rhodanine skeleton.

The rhodanine skeleton formation includes reacting a variety of amino acids with carbon disulfide in the presence of a base such as ammonia, triethylamine, NaOH, or KOH, to thereby synthesize a dithiocarbamate salt; subsequently reacting the salt with sodium chloroacetate or ethyl chloroacetate; and further performing cyclization under acidic conditions adjusted by hydrochloric acid, sulfuric acid, or a similar compound. No particular limitation is imposed on the solvents employed in the rhodanine skeleton formation, and solvents such as water, ethers, and DMF can be used in accordance with the employed amino acid.

Examples of amino acid compounds serving as starting materials include glycine, β-alanine, DL-methionine, 6-aminocaproic acid, L-glutamine, L-tyrosine, phenylalanine, leucine, valine, asparagine, threonine, and aminobenzoic acid.

In a similar manner, a rhodanine compound having a sulfonic acid group in an N-substituent can be synthesized. Examples of the starting materials include taurine and aminobenzenesulfonic acid.

Examples of reagents which convert a carboxylic acid or sulfonic acid group to the corresponding acid chloride and reagents which activate amidation or esterification include thionyl chloride, oxalyl chloride, dicyclohexyl carbodiimide, carbonylimidazole, 2-chloro-1-methylpyridinium iodide, trimethylacetyl chloride, disuccinimide carbonate, and phosphoric-acid-based condensing agents.

Regarding the compounds containing a primary or secondary amino group serving as amidation sources, a wide variety of compounds can be employed. Examples, which could be very limited, include aniline, sulfanilic acid, aminobenzoic acid, allylamine, amino acids, N-phenylaminobutylaldehyde dimethyl acetal, N-benzylaminobutylaldehyde dimethyl acetal, aminobutylaldehyde dimethyl acetal, N-methylaminoacetoaldehyde dimethyl acetal, aminoaldehyde dimethylacetal, ethylenediamine, diaminopropane, diaminobutane, diaminohexane, diaminoheptane, phenylenediamine, polyvinylamine, diaminosiloxane, and Jeffamine (polyetheramine; D-400, ED-600, ED-900, and EDR-148).

Among the photosensitive compounds of the present invention, compounds represented by the aforementioned formulas (III) to (VI) are particularly useful as bichromate-free photosensitive material and low-pollution and high-photosensitivity polymer, in that these compounds permit introduction of a photosensitive group to a poly(vinyl alcohol) skeleton through acetalization.

Of these, compounds containing an acetal moiety and a primary or secondary amino group are preferred as amida tion sources. Typical examples include the following compounds.

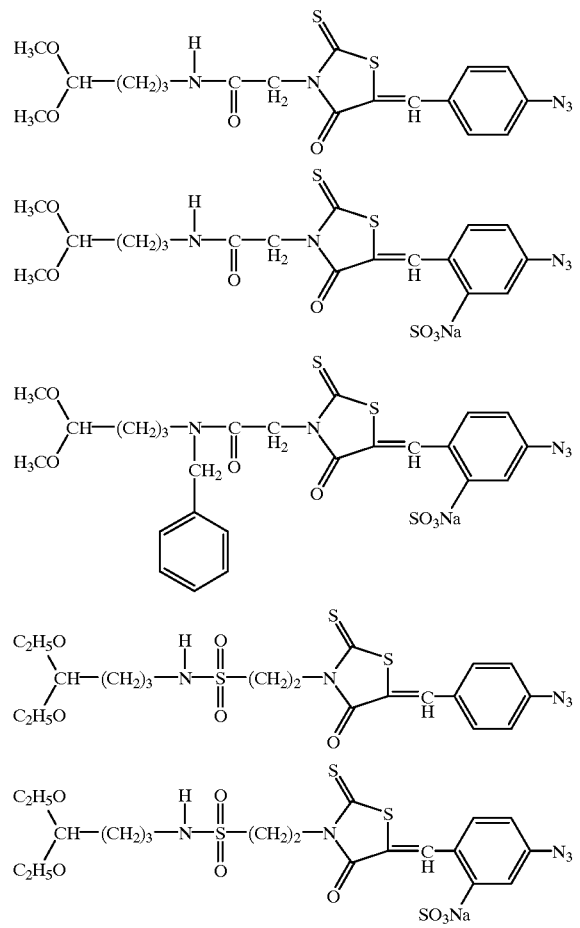

The photosensitive compounds of the present invention represented by the aforementioned formulas (III) to (VI) are reacted in the presence of an acid catalyst with a saponified product of poly(vinyl acetate) or with a water-soluble copolymer comprising vinyl alcohol and another vinyl compound, to thereby form the photosensitive resin of the present invention represented by the aforementioned formula (VII) or (VIII).

The saponified product of polyvinyl acetate preferably employed in the above reaction has an average polymerization degree of 200–5,000 and a saponification degree of 60–100%, for example. Examples of the saponified product of polyvinyl acetate which may be used include a saponified product of polyvinyl acetate modified with a hydrophilic group, an anion, a cation, or a reactive group such as an acetoacetyl group.

When the average polymerization degree is less than 200, obtaining sufficient sensitivity is difficult; whereas when it is in excess of 5,000, the viscosity of the solution of the photosensitive resin increases, often disadvantageously resulting in poor coating characteristics. Furthermore, when the concentration is decreased in order to reduce the viscosity, obtaining the desired coating film thickness is difficult. When the saponification degree is less than 60%, obtaining sufficient solubility and developability with water is difficult.

The water-soluble copolymer of vinyl alcohol and another vinyl compound which may be used has an average polymerization degree of 200–5,000, for example. Examples of the vinyl monomers to be copolymerized with vinyl alcohol include N-vinylpyrrolidone and acrylamide.

When such saponified products of polyvinyl acetate are reacted with the photosensitive compounds represented by the aforementioned formulas (III) to (VI) in the presence of an acid catalyst to thereby obtain the photosensitive resin represented by the aforementioned formula (VII) or (VIII), an aldehyde or an acetal thereof may simultaneously be reacted. Examples of the aldehyde include aliphatic aldehydes such as formaldehyde, acetaldehyde, propionaldehyde, butylaldehyde, and benzaldehyde.

The ratio of introduction of the photosensitive compound represented by any one of formulas (III) to (VI) to a saponified product of polyvinyl acetate is preferably about 0.3–5 mol % of monomer units.

The photosensitive resin of the present invention can be employed in a photosensitive resin composition for pattern formation.

The pattern formation method comprises a coating film formation step in which a photosensitive resin composition is applied onto a substrate to thereby form the coating film of the photosensitive resin composition; an exposure step in which the coating film of the photosensitive composition is irradiated for a desired pattern; and a development step in which the patternwise-exposed coating film is developed with water or an aqueous developer to form a photo-cured pattern.

The photosensitive resin composition may further contain a water-soluble polymer or a water-soluble azide compound. The substrate to which the photosensitive resin composition is applied may be an inner face of a color cathode-ray tube.

The pattern formation method may further comprise, after the aforementioned development step, steps of applying a graphite slurry onto the entirety of the aforementioned photo-cured pattern, drying to form a graphite coating film, and removing the aforementioned photo-cured pattern by use of a remover to form a black matrix.

Alternatively, the aforementioned photosensitive resin composition may further contain a phosphor, and a phosphor pattern may be formed through the aforementioned development step.

Also, the aforementioned photosensitive resin composition may further contain a pigment, and a color filter may be formed through the aforementioned development step.

As described above, the photosensitive resin may be used together with a water-soluble polymer. Examples of water-soluble polymers include a saponified product of poly(vinyl acetate); a polymer of a natural product such as gelatin, a cellulose derivative, or casein; and a polymer or a copolymer comprising a water-soluble vinyl monomer. Examples of water-soluble vinyl monomers include N-vinylformamide, N-vinylacetamide, vinylpyrrolidone, acrylamide, diacetoneacrylamide, N,N-dimethylacrylamide, vinylpyridine, methacrylamide, and allylthiourea. The amount of the photosensitive resin of the present invention in relation to the total amount of water-soluble polymer is preferably 0.5% or more.

As described above, the photosensitive resin may be used together with a water-soluble azide compound. Examples of the water-soluble azide compound include 4,4'-diazidostilbene-2,2'-disulfonic acid, 4,4'-diazidobenzalacetophenone-2-sulfonic acid, 4,4'-diazidostilbene-α-carboxylic acid, and salts thereof such as alkali metal salts, ammonium salts, and organic amine salts. Further, there are preferably used water-soluble azide compounds described in Japanese Patent Publication (kokoku) No. 50-27404 and Japanese Patent Application Laid-Open (kokai) Nos. 50-141403, 2-204750, 4-26849, 5-11442, 5-113661, and 6-239930.

Additives such as ethylene glycol, sorbitol, and surfactants may optionally be added to the photosensitive resin composition of the present invention containing the photosensitive resin, in order to improve the coatability and moisture-retention property thereof. A silane coupling agent which serves as an adhesion-accelerator may optionally be added to the photosensitive resin composition of the present invention in order to improve adhesion thereof to a substrate. Examples of the adhesion-accelerator include water-soluble adhesion-accelerators such as N-β(aminoethyl)-aminopropylmethyldimethoxysilane and N-β(aminoethyl)-γ-aminopropyltrimethoxysilane.

Additives such as a preservative, a defoaming agent, or a pH-adjusting agent may optionally be added to the photosensitive resin composition used in the present invention.

Hydrophobic polymer emulsions may optionally be added to the photosensitive resin composition in order to improve film strength, water resistance, and adhesion to a variety of substrates. Examples of hydrophobic emulsions include a polyvinyl acetate emulsion, a polyacrylic acid ester emulsion, and a urethane emulsion. A pattern formation method making use of a composition containing the hydrophobic polymer emulsion is suitably employed for a screen printing plate, for example.

Further, colorants such as a pigment or a dye may be added to the photosensitive resin composition used in the present invention, in order to prevent halation induced by exposure and to obtain a colored image.

In particular, the colored image obtained through dispersing a pigment in the photosensitive resin composition may be applied to a color filter for a liquid crystal display, for a color cathode-ray tube, or for a plasma display; a color proof for printing; a secondary original image for printing; etc.

The pattern formation method making use of the photosensitive resin composition as described above comprises, for example, a coating film formation step in which a photosensitive resin composition is applied onto a substrate; an exposure step in which the photosensitive composition coating film is irradiated for a desired pattern; and a development step in which the patternwise-exposed photosensitive composition coating film is developed with water or an aqueous developer to form a photo-cured pattern.

Examples of substrates to which the resin composition is applied include an inner face plate of a color cathode-ray tube. Consequently, the black matrix of a color cathode-ray tube, a phosphor pattern, a color filter, etc. can be specifically formed.

The pattern formation method by use of the photosensitive resin composition of the present invention containing the photosensitive resin will next be described in detail.

(1) Step for Forming a Coating Film of the Photosensitive Composition on a Substrate No particular limitation is imposed on the substrate which may be used in the present invention, and any substrate to which the photosensitive composition of the present invention can adhere may be used. Examples of substrates include glass such as common glass, $SiO_2$-treated glass, or ITO-coated glass; plastic film and sheets such as polyester film, polyamide film, poly(vinyl chloride) film, and polypropylene film; metal substrates; metal-laminated plastic sheets and film; mesh; and silicon wafers.

Examples of a coating method for the photosensitive composition of the present invention include spin coating, roll-coater coating, curtain coating, and applicator coating, which have conventionally been employed. The coated layer is subsequently dried through a customary method at a specific temperature, to thereby obtain a coating film.

(2) Pattern Exposure Step

Any customary light source may be used for the exposure of the aforementioned coating film of the photosensitive composition, so long as it emits light having a wavelength at which the photosensitive resin used in the present invention can be sensitized. Examples include an ultra-high-pressure mercury lamp, a high-pressure mercury lamp, a xenon lamp, a metal halide lamp, and a chemical lamp. Also, there may be employed any customary exposure method, such as the reduction-projection exposure method, the contact exposure method, or the proximity exposure method.

(3) Development Step

The aforementioned patternwise-irradiated coating film of the photosensitive composition can be developed by use of water, a mixture solvent of water-aqueous solvent, or an aqueous solution containing an acid, an alkali, a pH-adjusting agent, a surfactant, etc. Examples of development methods include spray-development, dipping-development, paddle-development, etc., which are customary methods.

As described above, the pattern formation method is particularly advantageous when applied to an inner face plate of a color cathode-ray tube. Application of the aforementioned pattern formation method to the aforementioned inner face plate of a color cathode-ray tube assures high sensitivity and high resolution, and therefore high productivity is realized.

For example, in the case in which the black matrix of a color cathode-ray tube is formed, graphite is applied onto the aforementioned formed pattern and the coated pattern is etched with a remover. In this case, a fine black matrix is obtained, due to the good etchability of the pattern formed in accordance with the present invention.

Examples of removers include an aqueous solution of acidic compounds such as periodic acid and hydrogen peroxide; acids such as sulfuric acid, sulfamic acid, nitric acid, or dodecylbenzenesulfonic acid; and mixtures thereof.

In the case of formation of a phosphor pattern, a photosensitive composition containing a phosphor is homogeneously applied onto a substrate on which the phosphor pattern is formed; e.g., the aforementioned black matrix on the inner surface of a face plate of a color cathode-ray tube, and is then dried. The coated composition is exposed to a UV beam through a mask having a predetermined pattern, and then developed with water so that only the exposed parts remain. When three phosphors; i.e., red (R), green (G), and blue (B), are used, the aforementioned steps are performed three times to thereby complete the phosphor face.

In the case of formation of a color filter, a photosensitive composition containing an inorganic pigment is homogeneously applied onto a substrate on which the color filter is formed; e.g., the black-matrix-equipped face plate of a color cathode-ray tube, and is then dried. The coated composition is exposed to a UV beam through a mask having a predetermined pattern, and then developed with water so that only the exposed parts remain. When three different inorganic pigments of red (R), green (G), and blue (B) are used, the aforementioned steps are performed three times to thereby complete the color filter.

EXAMPLES

The present invention will next be described in detail by way of example.

Example 1

Synthesis of rhodanine-3-acetic acid Represented by the Following Formula

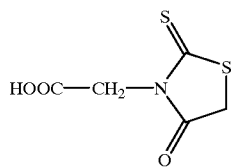

Glycine (19 g) and sodium hydroxide (20 g) were dissolved in water (50 g), and the resultant solution was cooled to 10° C. Carbon disulfide (19 g) was added dropwise to the solution over 30 minutes with stirring, and then the mixture was allowed to react at 20° C. for three days. Subsequently, a solution of sodium chloroacetate (29 g) in water (60 g) was added dropwise to the reaction mixture over 15 minutes, and the resultant mixture was allowed to react at room temperature for 24 hours. Concentrated hydrochloric acid (90 g) and water (32 g) were added to the reaction mixture, and the resultant mixture was allowed to react at 80° C. for five hours. After completion of reaction, precipitated target crystals were separated through filtration, washed with cold water, and dried to 50° C. for one day, to thereby yield 24 g of the crystals. The purity of the product, as obtained through liquid chromatography, was 98%.

Example 2

Synthesis of [3-(N-(4,4'-dimethoxybutyl)carbamoyl) methyl]rhodanine

In acetonitrile (500 ml), rhodanine-3-acetic acid (19 g) synthesized in Example 1, aminobutylaldehyde dimethyl acetal (13 g), and 2-chloro-1-methylpyridinium iodide (26 g) were dispersed to dissolution. To the solution, triethylamine (10 g) was added dropwise at 10° C. over 30 minutes, and then, the resultant mixture was allowed to react at 10° C. for two hours and at room temperature for 22 hours, to thereby yield a solution, in acetonitrile, of the target compound represented by the following formula.

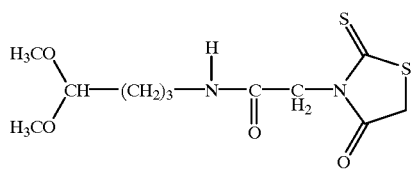

Example 3

Synthesis of [5-(sodium 4-azidobenzylidene-2-sulfonate)-3-(N-(4,4'-dimethoxybutyl)carbamoyl) methyl]rhodanine Represented by the Following Formula

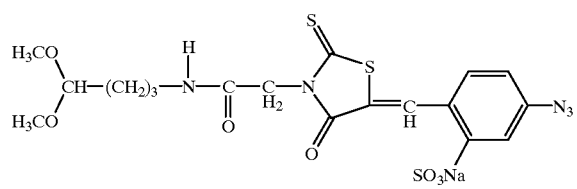

Sodium 4-azido-benzaldehyde-2-sulfonate (25 g) was dissolved in water (1,000 ml), to thereby prepare an aqueous solution, and the solution was cooled to 10° C. The cooled solution was added to the acetonitrile solution prepared in Example 2. The mixture was allowed to react at room temperature for three days. To the reaction mixture, water (4,200 ml) and NaCl (741 g) were sequentially added, to thereby salt out a target compound. The reaction system was stirred further for five hours, and the target compound was separated through filtration. The compound was washed with acetone, to thereby yield 43 g of crystals thereof (yield 80%). The purity of the product, as obtained through liquid chromatography, was 99%. The compound exhibited maximum absorption at 388 nm.

The NMR data are shown below. $^1$H-NMR (DMSO-d$^6$): δ=1.38–1.45 (m, 2H); δ=1.46–1.48 (m, 2H); δ=3.04–3.06 (m, 2H); δ=3.18 (s, 6H); δ=4.28–4.31 (m, 1H); δ=4.60 (s, 2H); δ=7.25–7.27 (m, 1H); δ=7.52–7.55 (m, 2H); δ=8.28–8.34 (m, 1H); δ=8.71 (s,1H) $^{13}$C-NMR (DMSO-d$^6$): δ=24.5; 29.8; 39.3; 46.4; 52.8; 103.9; 118.2; 120.5; 122.5; 126.8; 130.6; 132.8; 141.4; 149.8; 164.6; 166.5; 193.9

Example 4

Synthesis of rhodanine-3-acetyl chloride

Rhodanine-3-acetic acid (19 g) prepared in Example 1 and oxalyl chloride (32 g) were added to benzene (400 ml), and the mixture was allowed to react at 20° C. for two hours and, further, for two hours under reflux conditions. After removal of the solvent through distillation, acetonitrile (500 ml) was added to the resultant matter, to thereby yield a solution, in acetonitrile, of the target compound represented by the following formula.

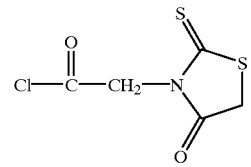

Example 5

Synthesis [3-(N-(4,4'-dimethoxybutyl)carbamoyl) methyl]rhodanine

To the solution of rhodanine-3-acetyl chloride in acetonitrile prepared in Example 4, aminobutylaldehyde dimethylacetal (13 g) was added. Triethylamine (10 g) was added dropwise to the mixture at 10° C. over 30 minutes. Subsequently, the resultant mixture was allowed to react at 30–40° C. for two hours and, further, at room temperature for 22 hours, to thereby yield a solution, in acetonitrile, of the target compound represented by the following formula.

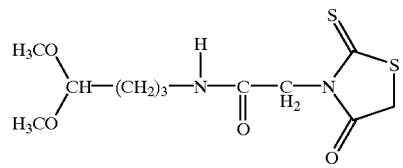

Example 6

Synthesis of [5-(sodium 4-azidobenzylidene-2-sulfonate)-3-(N-(4,4'-dimethoxybutyl)carbamoyl) methyl]rhodanine In a manner similar to that described in Example 3, the compound obtained in Example 5 was reacted with sodium 4-azido-benzaldehyde-2-sulfonate, to thereby yield the title target compound.

Example 7

Measurement of [5-(sodium 4-azidobenzylidene-2-sulfonate)-3-(N-(4,4'-dimethoxybutyl)carbamoyl)methyl]-rhodanine in Terms of Solubility in Water and Molar Absorption Coefficient Measurement of solubility in water at 25° C. was carried out for the compound obtained in Example 3 or 6, and for the compound, which was obtained through the method of Example 2 described in Japanese Patent Application Laid-Open (kokai) No. 10-310769, represented by the following formula.

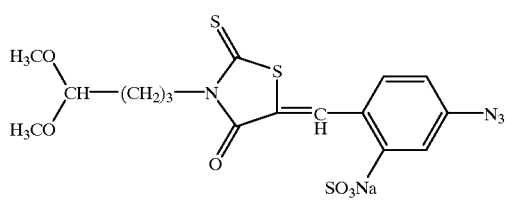

In 100 g of water, the compound according to the present invention exhibited a solubility of 5.4 g, and the reference compound exhibited a solubility of 1.1 g. The results confirm that the solubility of the former compound is approximately five times that of the latter compound, due to an amido bonding contained in the former compound. Further, UV spectra were measured for the two compounds in water serving as a solvent so as to measure the molar absorption coefficient $\epsilon$ at a wavelength of maximum absorption. The former exhibited 31,120 ($\lambda_{max}$=388 nm) and the latter 30,233 ($\lambda_{max}$=388 nm), which were approximately equal to each other.

Example 8

Synthesis of Photosensitive PVA

Poly(vinyl alcohol) (EG-30, product of Nippon Synth. Chem. Ind. Co., Ltd.) (100 g) was dissolved in water (900 g). To the resultant solution, the compound prepared in Example 3 or 6 (11 g) and phosphoric acid (3 g) were added. The mixture was allowed to react at 70° C. for 24 hours. The acetalization ratio was 97%. Phosphoric acid contained in the reaction system was removed through ion exchange, to thereby prepare a photosensitive liquid containing a photosensitive resin in which a photosensitive group was introduced at 1.0 mol % based on PVA.

Test Example

The photosensitive liquid obtained from Example 8 was diluted to a 5% liquid, and the diluted liquid was applied onto a glass plate having a thickness of 1.0 μm. Measurement of the UV spectrum of the applied coating film revealed that the maximum absorption peak was found at 391 nm. Subsequently, the coating film was exposed to UV light from an ultra-high-pressure mercury lamp at an energy of 1 mJ (illuminance: 5 mw/cm², UV-35 (illuminance meter, product of OKU)). The thus-exposed film was developed with water. It was confirmed that 50-μm-width lines were obtained through the development process without development failure.

As described hereinabove, according to the present invention, a novel rhodanine-skeleton-containing an azide compound can be produced through condensation of a rhodanine compound having an acetal group and an amido bonding portion, and an azido-group-containing aromatic aldehyde. Through introduction of a photosensitive moiety derived from the compound into a water-soluble polymer, a high-sensitivity photoresist which can be readily developed with water can be provided.

What is claimed is:

1. A photosensitive compound having a moiety represented by the following formula (I) or (II):

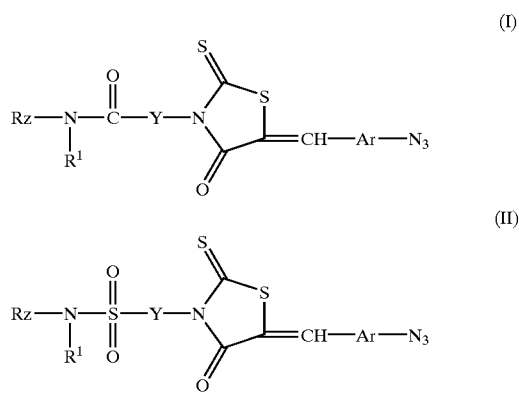

wherein $R_x$ is a saponified product of poly(vinyl acetate) chain or a substituent containing an acetal group or a substituent containing an aldehyde group, and $R^1$ represents a hydrogen atom, a C≦6 alkyl group, a phenyl group, or a benzyl group;

Y is selected from the following formula groups:

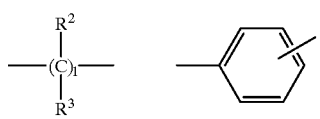

wherein each of $R^2$ and $R^3$ represents a hydrogen atom or an alkyl group, and l is an integer of 1 to 5; and Ar is selected from the following formula groups;

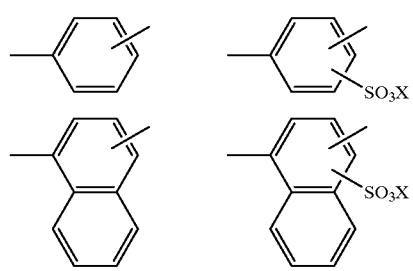

wherein X represents lithium sodium, potassium, ammonium, monoalkylammonium, dialkylammonium, trialkylammonium, or tetraalkylammonium.

2. A photosensitive compound according to claim 1, which is represented by any one of the following formula (III) to (VI):

(III)

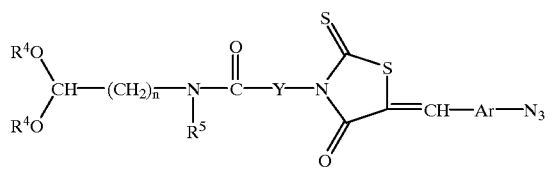

(IV)

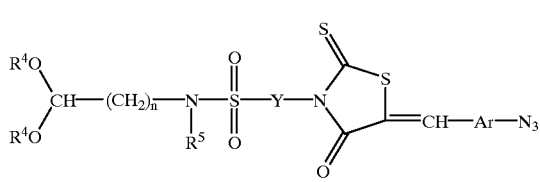

(V)

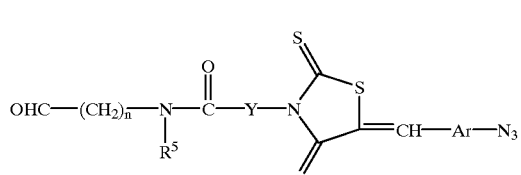

(VI)

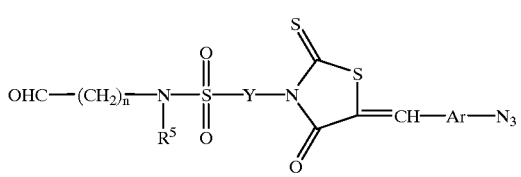

wherein
- $R^4$ is selected from among $C \leq 6$ alkyl groups, and two $R^4$s may he joined to each other to form —$(CH^2)m$—, wherein m is 2 or 3;
- n is 1, 2, or 3;
- $R^5$ represents a hydrogen atom, a $C \leq 6$ alkyl group, a phenyl group or a benzyl group;
- Y is selected from the following formula groups:

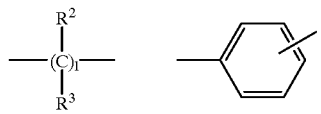

wherein each of $R^2$ and $R^3$, represents a hydrogen atom or an alkyl group, and l is an integer of 1 to 5; and Ar is selected from the following formula groups:

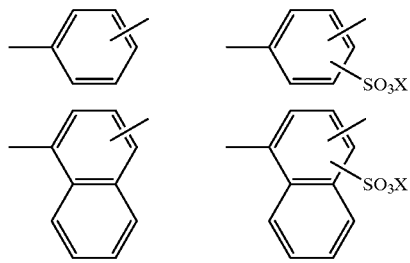

wherein X represents lithium, sodium, potassium, ammonium, monoalkylammonium, dialkylammonium, trialkylammonium, or tetraalkylammonium.

3. A photosensitive compound according to claim 1, comprising a structural unit represented by formula (VII) or (VIII):

(VII)

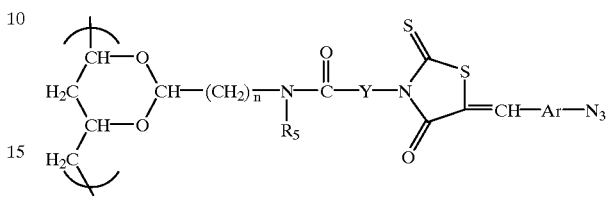

(VIII)

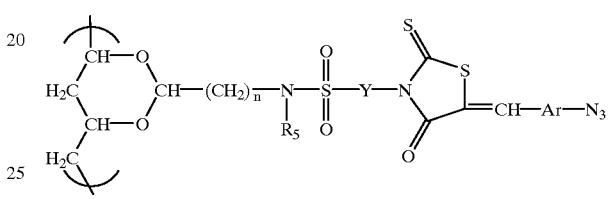

wherein,
- n is 1, 2, or 3;
- $R^9$ represent a hydrogen atom, an $C \leq 6$ alkyl group, a phenyl group, or a benzyl group;
- Y is selected from the following formula groups:

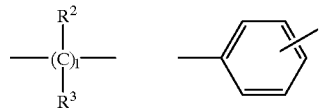

wherein each of $R^2$ and $R^3$ represents a hydrogen atom or an alkyl group, and l is an integer of 1 to 5; and Ar is selected from the following formula groups:

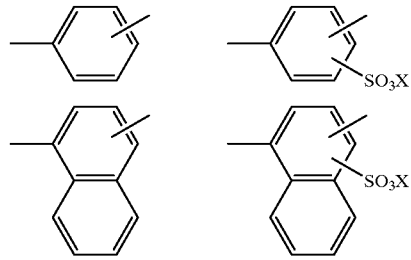

wherein X represents lithium, sodium, potassium, ammonium, monoalkylammonium, dialkylammonium, trialkylammonium, or tetraalkylammonium.

4. A photosensitive composition comprising a photosensitive compound as recited in claim 2.

5. A photosensitive composition comprising a photosensitive compound as recited in claim 3.

* * * * *

UNITED STATES PATENT AND TRADEMARK OFFICE
CERTIFICATE OF CORRECTION

PATENT NO. : 6,610,791 B2
DATED : August 26, 2003
INVENTOR(S) : Kentaro Tada et al.

It is certified that error appears in the above-identified patent and that said Letters Patent is hereby corrected as shown below:

Title page,
Item [73], Assignee, change "Toyo Gosai Kogyo Co., Ltd." to read -- Toyo Gosei Kogyo Co., Ltd. --.

Column 14,
Line 33, change "$R_x$" to read -- $R_z$ --.
Line 36, change "$C \leqq 6$" to read -- $C \leq 6$ --.

Column 15,
Lines 36 and 41, change "$C \leqq 6$" to read -- $C \leq 6$ --.
Line 37, change "–$(CH^2)m$–" to read -- –$(CH_2)m$– --.

Column 16,
Line 31, change "$C \leqq 6$" to read -- $C \leq 6$ --.
Line 31, change "$R^9$" to read -- $R_5$ --.

Signed and Sealed this

Fourth Day of November, 2003

JAMES E. ROGAN
*Director of the United States Patent and Trademark Office*